(12) United States Patent
Levesque et al.

(10) Patent No.: US 7,421,256 B2
(45) Date of Patent: Sep. 2, 2008

(54) LOW NOISE SWITCHING VOLTAGE REGULATOR

(75) Inventors: Chris Levesque, Fountain Valley, CA (US); Jaleh Komaili, Irvine, CA (US); Jason D. Millard, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/345,158

(22) Filed: Feb. 1, 2006

(65) Prior Publication Data

US 2006/0128325 A1   Jun. 15, 2006

Related U.S. Application Data

(63) Continuation of application No. 10/270,794, filed on Oct. 15, 2002, now Pat. No. 7,058,374.

(51) Int. Cl.
*H01Q 11/12* (2006.01)
(52) U.S. Cl. .................. 455/127.3; 455/127.1; 455/522; 330/297
(58) Field of Classification Search .............. 455/127.1, 455/127.3, 127.5, 194.2, 522, 311, 253.2, 455/309, 341, 572, 574, 343.1, 343.5, 127.2; 330/297, 199, 202, 285, 127, 295; 375/297, 375/295
See application file for complete search history.

(56) References Cited

U.S. PATENT DOCUMENTS

| 4,015,252 | A | * | 3/1977 | Symanski | 341/100 |
| 4,320,447 | A | * | 3/1982 | Krauss | 363/63 |
| 5,185,765 | A | * | 2/1993 | Walker | 375/238 |
| 5,892,403 | A | * | 4/1999 | Brandt | 330/297 |
| 6,147,631 | A | * | 11/2000 | Maulik et al. | 341/122 |
| 6,304,761 | B1 | * | 10/2001 | Tsunehiro | 340/7.32 |
| 6,606,308 | B1 | * | 8/2003 | Genest et al. | 370/318 |
| 7,058,374 | B2 | * | 6/2006 | Levesque et al. | 455/127.3 |

* cited by examiner

*Primary Examiner*—Nay Maung
*Assistant Examiner*—Richard Chan (57) ABSTRACT

A low-noise switching voltage regulator for supplying a voltage to a radio frequency (RF) power amplifier is disclosed. In one embodiment, the invention can be conceptualized as a power amplifier supply circuit, comprising a pair of oppositely polarized semiconductor switches, and a data formatter configured to supply a data stream having a voltage transition on at least every other bit to each of the pair of oppositely polarized semiconductor switches.

14 Claims, 7 Drawing Sheets

LOW NOISE SWITCHING VOLTAGE REGULATOR

CROSS REFERENCE TO RELATED APPLICATION

This application is a continuation of commonly assigned U.S. patent application Ser. No. 10/270,794, filed on Oct. 15, 2002 now U.S. Pat. No. 7,058,347 entitled "Low Noise Switching Voltage Regulator," the disclosure of which is hereby incorporated herein by reference.

BACKGROUND OF THE INVENTION

1. Field of the Invention

This invention relates generally to controlling radio frequency (RF) transmission power and maximizing battery life in a portable communications device. More particularly, the invention relates to a low noise switching voltage regulator.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset.

While the different modulation and transmission schemes each have advantages and disadvantages, a common goal for all of these devices is maximizing the amount of time that a handset can operate on a single battery charge. This is referred to as maximizing the "talk time" of the handset.

Maximizing the talk time of a portable communication handset is typically the greatest challenge facing the designers of such devices. While many different approaches have been investigated, the single greatest improvement in talk time is generally achieved by reducing the power consumption of the RF PA. Typically, the RF PA consumes the greatest amount of power in a portable communication handset.

Many techniques have been implemented in an attempt to reduce the power consumption of the RF power amplifier. One such technique is the use of a switching voltage regulator to reduce the supply voltage supplied to an RF power amplifier. By reducing the voltage to the PA it can be operated closer to the saturation point, and hence the efficiency of the transmitter can be improved. There are two primary issues that should be resolved before this technique can be practically realized. The first issue has to do with the output noise or "ripple" of the switching supply that will be used to supply the RF PA. Any noise present on the supply of the RF PA will manifest as noise in the output RF spectrum of the RF PA. Most communications standards, such as the global system for mobile communications (GSM) have strict specification limits on the amount of noise the system is allowed to add to the transmitted frequency.

To comply with the power output spectrum standard for GSM, the power output of an RF power amplifier is tested against a specified power output specification, referred to as a power output spectral "mask." The mask defines an RF spectrum within which the power output of the RF power amplifier must reside. Out-of-band emission, spurious emission and other factors are tightly controlled. If any portion of the output of the RF power amplifier violates the spectrum defined by the mask, the portable communication handset will fail the power spectral mask test and will not be permitted to operate in the communication system. Other communication standards, have similar power output mask specifications.

The second issue concerning RF PA saturation demands careful control of the RF PA supply signal such that the RF PA power saturation point is above the desired output power of the system. If these conditions aren't met, the power ramp-up and ramp-down required by GSM will allow RF power to migrate into adjacent channels and could cause the power amplifier to fail the switching transient specification such as those set forth by GSM standard 11.10.

Furthermore, in existing portable communication handsets that use a switching voltage regulator to supply voltage to an RF power amplifier, the efficiency of the power amplifier is limited due to lack of ability to reduce the ripple to an acceptable level.

One manner of reducing the ripple is to carefully select components in the switching voltage regulator to absorb and minimize the ripple. Unfortunately, this typically leads to unacceptably large and costly components.

Therefore, there is a need in the industry to further reduce power consumption and increase talk time in a portable communication handset.

SUMMARY

Embodiments of the invention include a low-noise switching voltage regulator for supplying a voltage to a radio frequency (RF) power amplifier. In one embodiment, the invention can be conceptualized as a power amplifier supply circuit, comprising a pair of oppositely polarized semiconductor switches, and a data formatter configured to supply a data stream having a voltage transition on at least every other bit to each of the pair of oppositely polarized semiconductor switches.

Related systems and methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the switching voltage regulator can be implemented in any system where it is desirable to use a switching voltage regulator to control a power amplifier. The switching voltage regulator, or portions of the control system for the switching voltage regulator, can be implemented in software, software, hardware, or a combination of software and hardware. In a preferred embodiment, the switching voltage regulator is implemented in hardware, as will be described below. The hardware portion of the invention can be implemented using specialized hardware elements and logic. Furthermore, the hardware implementation of the switching voltage regulator can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

If control of the switching voltage regulator is implemented in software, portions of the switching voltage regulator control software may comprise an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1A:
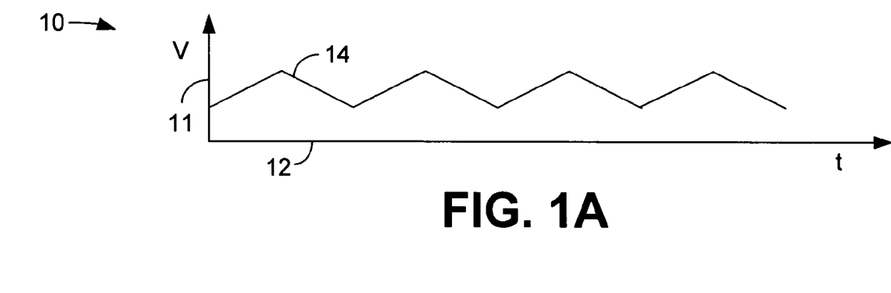
FIG. 1A is a graphical illustration showing the effect of switching noise, or ripple, on the output of a conventional switching voltage regulator.

FIG. 1A is a graphical illustration 10 showing the effect of switching noise, or ripple, on the output of a conventional switching voltage regulator. The vertical axis 11 represents voltage and the horizontal axis 12 represents time. As shown in FIG. 1A a generally triangular waveform 14 results at the output of a conventional switching voltage regulator. The triangular, or "saw-tooth" waveform is a result of the operation of the switches within the switching voltage regulator. The ripple as shown in FIG. 1A manifests as an alternating current (AC) signal superimposed on the direct current (DC) output of a conventional switching voltage regulator.

When used to control a power amplifier, such as a power amplifier located in a portable communication handset, this switching ripple at the output of a conventional switching voltage regulator manifests as discrete energy tones at the switching frequency of the switching voltage regulator. These discrete tones are superimposed on the output of the power amplifier of a portable communication handset. When a portable communication handset is used, for example, in the GSM communication system, which has very stringent power output requirements, these discrete tones will likely cause the portable communication handset to fail the output RF spectrum specification.

Figure 1B:
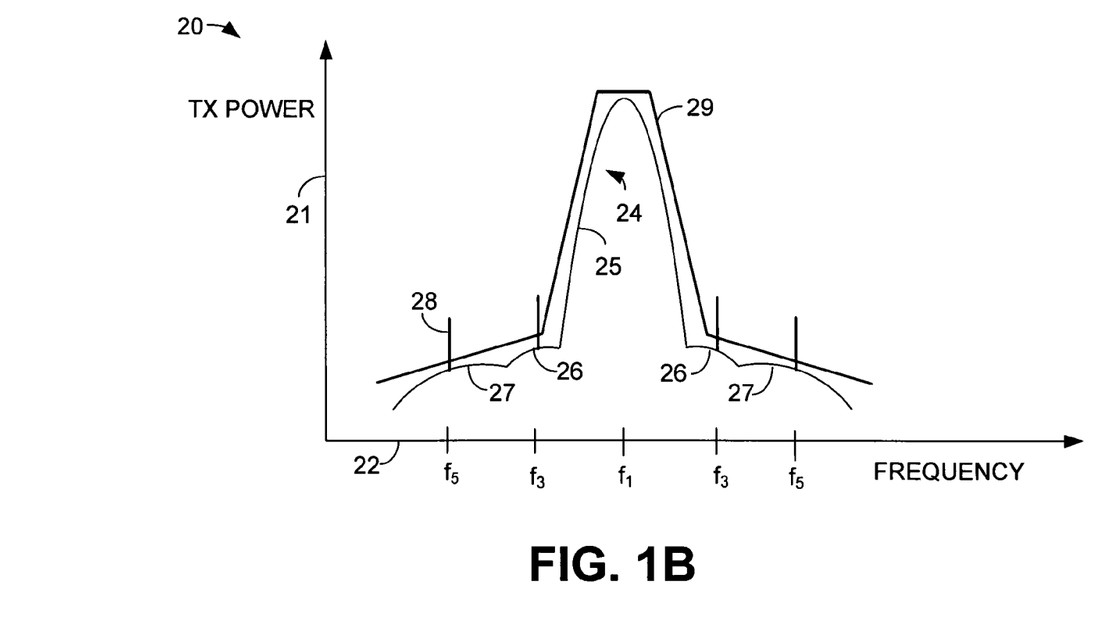
FIG. 1B is a graphical illustration showing the effect of the ripple shown in FIG. 1A on the output spectrum of a portable communication handset.

FIG. 1B is a graphical illustration 20 showing the effect of the ripple shown in FIG. 1A on the output spectrum of a portable communication handset. The vertical axis 21 represents transmit (TX) power and the horizontal axis 22 represents frequency. The waveform 24 represents the transmit output of the power amplifier at a fundamental frequency $f_1$ of a portable communication handset. The waveform 24 includes a central portion 25 located at the fundamental frequency $f_1$ of the transmit channel and includes energy at the third and fifth order frequency harmonics in the regions indicated by reference numerals 26 and 27, respectively.

Reference numeral 29 illustrates an exemplary power output mask, which defines the transmit power over a given frequency range within which the waveform 24 must reside to pass the GSM output mask standard. This standard includes limitations on various transmit energy parameters including, for example, out-of-band signal propagation and spurious emission. As shown in FIG. 1B, the output spectrum includes frequency tones, an exemplary one of which is indicated using reference numeral 28, that represent the switching ripple produced by a switching voltage regulator. These tones 28, which occur at the frequency and at frequency harmonics, such as the third and fifth harmonics as shown in FIG. 1B, of the switching voltage regulator, are caused by the switching effect of the voltage regulator. If the power level of these tones exceed the power level allowed by the mask 29 for a particular frequency, the portable communication handset will likely fail the output spectral mask specification. However, even if these tones manifest within the limits of the mask 29, they may still introduce errors if they are sufficiently close to the modulation signal represented by portion 25 of the waveform 24.

Accordingly, it is desirable to minimize, or distribute the energy that is contained in these discrete tones 28 over as broad a frequency range as possible, so that these tones do not effect the output of the power amplifier within the portable communication handset. Essentially, it is desirable to spread the energy contained in these tones 28 over a broad frequency range, thus reducing the apparent power in a given bandwidth.

Figure 2:
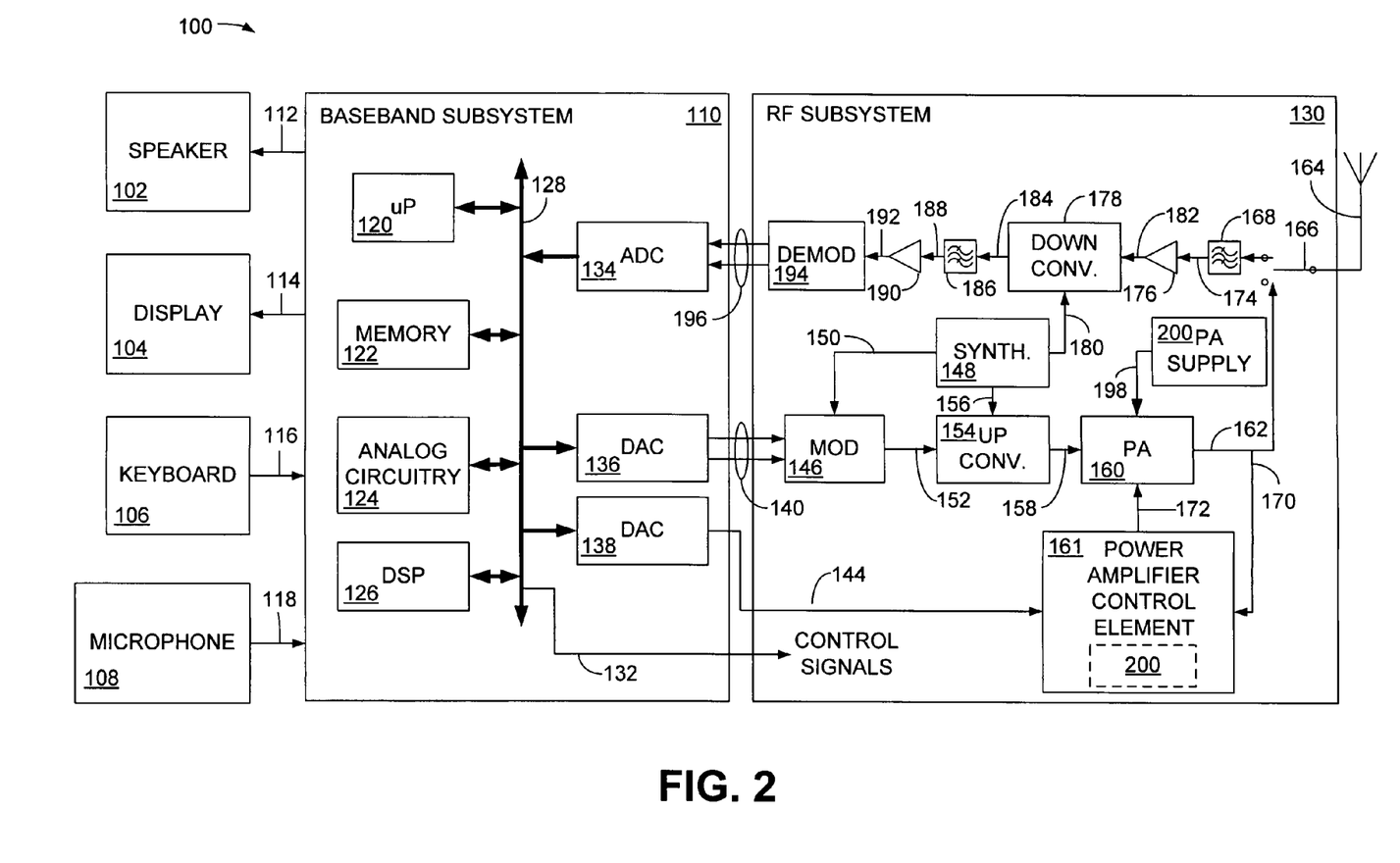
FIG. 2 is a block diagram illustrating a simplified portable transceiver 100.

FIG. 2 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated.

Baseband subsystem 110 also includes analog-to-digital converter (ADC) 134 and digital-to-analog converters (DACs) 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to power amplifier control element 161 via connection 144. Connection 140, while shown as two directed arrows, includes the information that is to be transmitted by RF subsystem 130 after conversion from the digital domain to the analog domain.

RF subsystem 130 includes modulator 146, which, after receiving a frequency reference signal, also called a "local oscillator" signal, or "LO," from synthesizer 148 via connection 150, modulates the received analog information and provides a modulated signal via connection 152 to upconverter 154. The modulated transmit signal may include only phase information, only amplitude information, or both phase and amplitude information, depending on the desired transmit format. Upconverter 154 also receives a frequency reference signal from synthesizer 148 via connection 156. Synthesizer 148 determines the appropriate frequency to which upconverter 154 will upconvert the modulated signal on connection 152.

Upconverter 154 supplies the modulated signal via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter (e.g., a diplexer) that allows simultaneous passage of both transmit signals and receive signals, as known to those having ordinary skill in the art.

The power amplifier receives a supply voltage from the power amplifier supply element 200 via connection 198. As will be described in further detail below, the power amplifier supply element 200 includes a switching voltage regulator that provides a low-ripple voltage signal to the power amplifier 160.

A portion of the amplified transmit signal energy on connection 162 is supplied via connection 170 to power amplifier control element 161. The power amplifier control element 161 may form a closed loop output power controller utilizing negative feedback to control the output power of power amplifier 160 and may also supply an analog power control (APC) signal via connection 172. In an alternative embodiment, as will be described below, the power amplifier supply element 200 may reside within the power control element.

A signal received by antenna 164 will be directed to receive filter 168. Receive filter 168 will filter the received signal and supply the filtered signal on connection 174 to low noise amplifier (LNA) 176. Receive filter 168 is a band pass filter, which passes all channels of the particular cellular system in which the portable transceiver 100 is operating. As an example, for a 900 MHz GSM system, receive filter 168 would pass all frequencies from 935.2 MHz to 959.8 MHz, covering all 124 contiguous channels of 200 kHz each. The purpose of this filter is to reject all frequencies outside the desired region. LNA 176 amplifies the very weak signal on connection 174 to a level at which downconverter 178 can translate the signal from the transmitted frequency back to a baseband frequency. Alternatively, the functionality of LNA 176 and down-converter 178 can be accomplished using other elements, such as, for example but not limited to, a low noise block downconverter (LNB).

Downconverter 178 receives a frequency reference signal, also called a "local oscillator" signal, or "LO," from synthesizer 148, via connection 180. The LO signal instructs the downconverter 178 as to the proper frequency to which to downconvert the signal received from LNA 176 via connection 182. The downconverted frequency is called the intermediate frequency or IF. Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing.

The foregoing description of the receiver components is for exemplary purposes only. Indeed, other receiver architectures, such as, for example but not limited to, a super heterodyne receiver, a direct conversion receiver, or a sampling receiver, are contemplated to be within the scope of the invention.

Figures 3A, 3B, 3C:
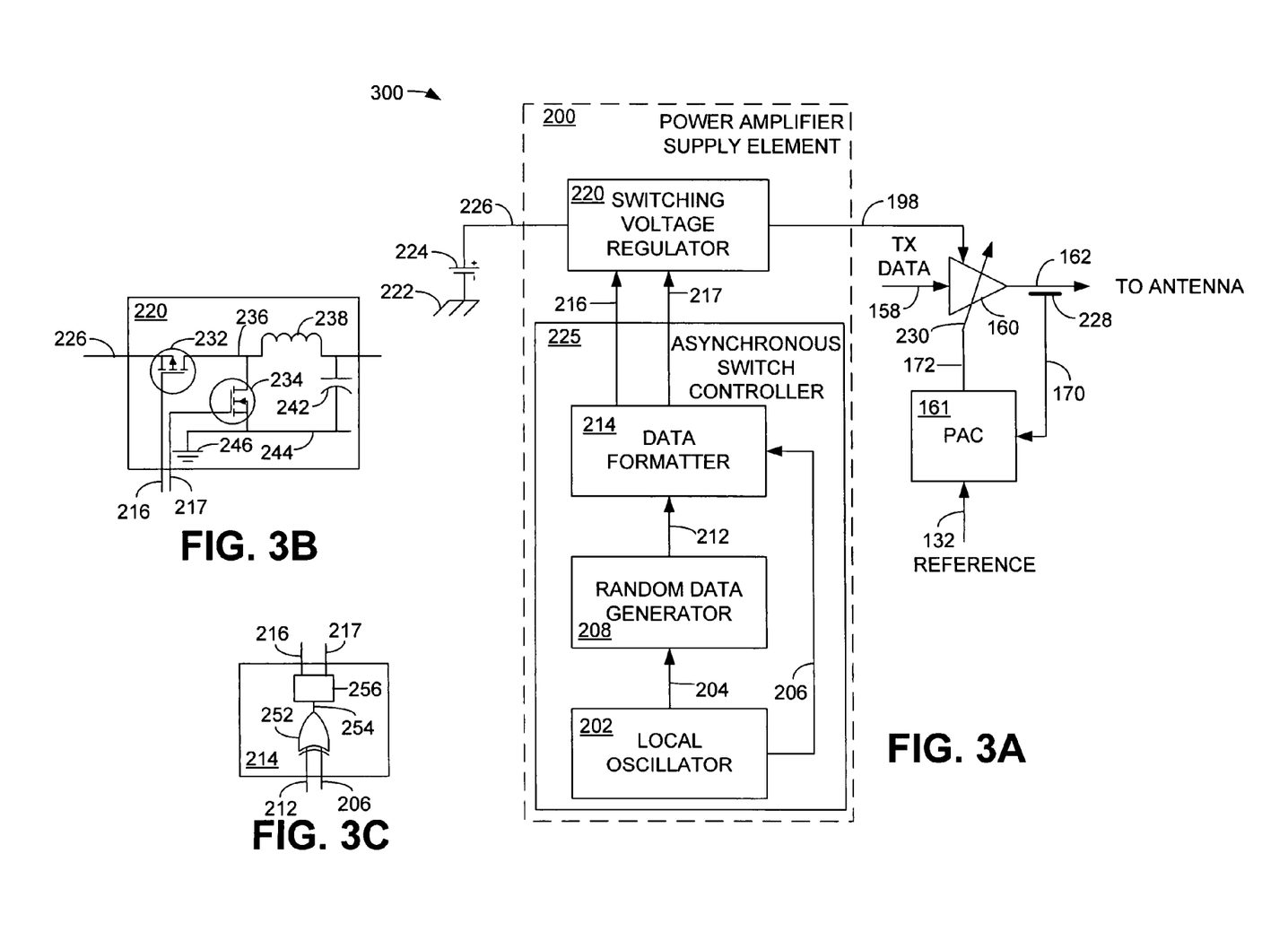
FIG. 3A is a block diagram illustrating a first embodiment of the power amplifier supply element of FIG. 2.
FIG. 3B is a block diagram illustrating the components within the switching voltage regulator of FIG. 3A.
FIG. 3C is a block diagram illustrating one exemplary embodiment of the data formatter of FIG. 3A.

FIG. 3A is a block diagram 300 illustrating a first embodiment 200 of the power amplifier supply element of FIG. 2. The embodiment illustrated in FIG. 3A is an asynchronous implementation of the power amplifier supply element 200. The power amplifier supply element 200 receives a DC voltage over connection 226 from, for example, a battery 224. However, it should be mentioned that any type of DC power source can be supplied via connection 226 to the power amplifier supply element 200. In a preferred embodiment, the power source 224 is a lithium ion battery supplying approximately 3.2 to 4.2 volts (V).

The output of the power amplifier supply element 200 is provided on connection 198 to the power amplifier 160. The power amplifier 160 also includes an input on connection 158 over which data to be transmitted (TX DATA) is modulated onto a high frequency carrier and supplied to the power amplifier 160. The power amplifier 160 provides an output over connection 162, which is directed to the antenna 164 (FIG. 2). To provide power control, and for exemplary purposes only, a portion of the output power of the amplifier 160 on connection 162 is diverted by a directional coupler 228 via a feedback connection 170 to the power amplifier control element 161. Other power detection methods, such as DC current sensing, and any other means that provide an accurate indication of the output power are possible.

The power amplifier control element 161 compares a reference signal on connection 132 with the feedback signal on connection 170 and develops a control signal on connection 172. The power amplifier control element 161 then supplies the control signal via connection 172 to the analog power control (APC) input 230 of the power amplifier 160. In this manner, the output of the power amplifier is controlled. Those having ordinary skill in the art will understand the operation of the power amplifier control element 161.

The power amplifier supply element 200 includes an asynchronous switch controller 225. The asynchronous switch controller 225 includes a local oscillator 202, which is similar in function to the synthesizer 148 of FIG. 2, a random data generator 208, and a data formatter 214. The output of the data formatter 214 is supplied to a switching voltage regulator 220 over connections 216 and 217. The local oscillator 202 provides a system clock signal over connection 206 to the data formatter 214. The local oscillator 202 also provides a local oscillator (LO) reference signal over connection 204 to the random data generator 208. The random data generator 208 uses the LO input over connection 204 to generate a random data stream over connection 212. The random data stream on connection 212 supplied to the data formatter 214 along with the clock signal from the local oscillator 202 over connection 206.

The implementation shown in FIG. 3A is considered "asynchronous" because the data generated by the random data generator 208 and supplied to the data formatter 214 over connection 212 bears no relation to the transmit data on connection 158 supplied to the power amplifier 160.

The data formatter 214 preferably provides a Manchester-type coded data stream to the switching voltage regulator 220 via connections 216 and 217. Manchester coding provides a voltage transition on every bit in the data stream. In Manchester coding, a binary "1" is represented by a pulse that has a positive voltage during the first half of the bit duration and a negative voltage during the second half of the bit duration. A binary "0" is represented by a pulse that is negative during the first half of the bit duration and positive during the second half of the bit duration. The negative or positive mid-bit transition indicates a binary 1 or binary 0, respectively. Thus, a Manchester code is classified as an instantaneous transition code in that it has no memory.

The random data on connection 212 is converted into a Manchester data stream by the data formatter 214 and supplied to the switching voltage regulator 220 via connections 216 and 217. However, it should be noted that a Manchester code is only a preferred embodiment. Any other coding scheme can be used, so long as a long string of 1's or 0's without voltage transitions is avoided. Importantly, the signal supplied to the switching voltage regulator 220 on connections 216 and 217 should include a sufficient number of voltage transitions so that neither one of the transistor switches within the switching voltage regulator 220 (to be described below), will remain in one state for more that a few bits. If this happens, the output voltage would either increase or decrease outside of the acceptable voltage range used by the power amplifier to meet the spectral mask specification.

By supplying a Manchester data stream to the switching voltage regulator 220 on connections 216 and 217, the switching voltage ripple (see FIG. 1A) or its frequency distribution (see FIG. 1B, reference numeral 28) illustrated for a non-Manchester case, at the output of the switching voltage regulator 220 on connection 198 is distributed over a broad frequency spectrum. This is so because the output spectrum of Manchester coding contains no energy at DC and very low energy at low frequencies as will be described below with respect to FIG. 6.

FIG. 3B is a block diagram illustrating the components within the switching voltage regulator 220 of FIG. 3A. The switching voltage regulator 220 includes a P-type field effect transistor (FET) 232 and an N-type FET 234. The gate terminal of the FET 232 is coupled to the connection 216 and the gate terminal of the FET 234 is coupled to connection 217. The source terminal of FET 232 is coupled to the DC voltage source on connection 226 while the drain terminal of FET 232 is coupled to the drain terminal of FET 234 on connection 236 and to an inductor 238. The source terminal of FET 234 is coupled to ground 246 via connection 244. The FETs 232 and 234 are activated based on the polarity of the signal received on connections 216 and 217, respectively. When FET 232 is switched on, FET 234 is switched off. The Manchester data stream on connections 216 and 217 ensure that the FETs 232 and 234 are continuously switching. The two FETS 232 and 234 are controlled by separate signals via connections 216 and 217 to avoid both FETS being switched on at the same time. Similarly, the FETS 232 and 234 are controlled so that they are not both switched off for more than a few microseconds (µs). To accomplish this, two non-overlapping signals are supplied by the data formatter 214 via connections 216 and 217, as will be discussed below.

The output of the FETs 232 and 234 on connection 236 passes through the inductor 238, which is also coupled in parallel to a capacitor 242. The output of the switching voltage regulator 220 is supplied via connection 198 to the power amplifier 160.

FIG. 3C is a block diagram illustrating one exemplary embodiment of the data formatter 214. In the embodiment shown in FIG. 3C, the data formatter 214 comprises an exclusive (XOR) gate 252 having inputs 206 and 212; A clock signal is received from the local oscillator 202 on connection 206 and the data from the random data generator 208 is supplied to the XOR gate 252 on connection 212. The output of the XOR gate 252 on connection 254 is supplied to a gate driver 256. The gate driver 256 develops output signals on connections 216 and 217. The signal on connections 216 and 217 is the Manchester data stream as described above. The outputs on connections 216 and 217 are non-overlapping signals and are opposite in phase such that the FETs 232 and 234 are not switched on simultaneously, and are not both switched off for more than a few microseconds.

Figure 4:
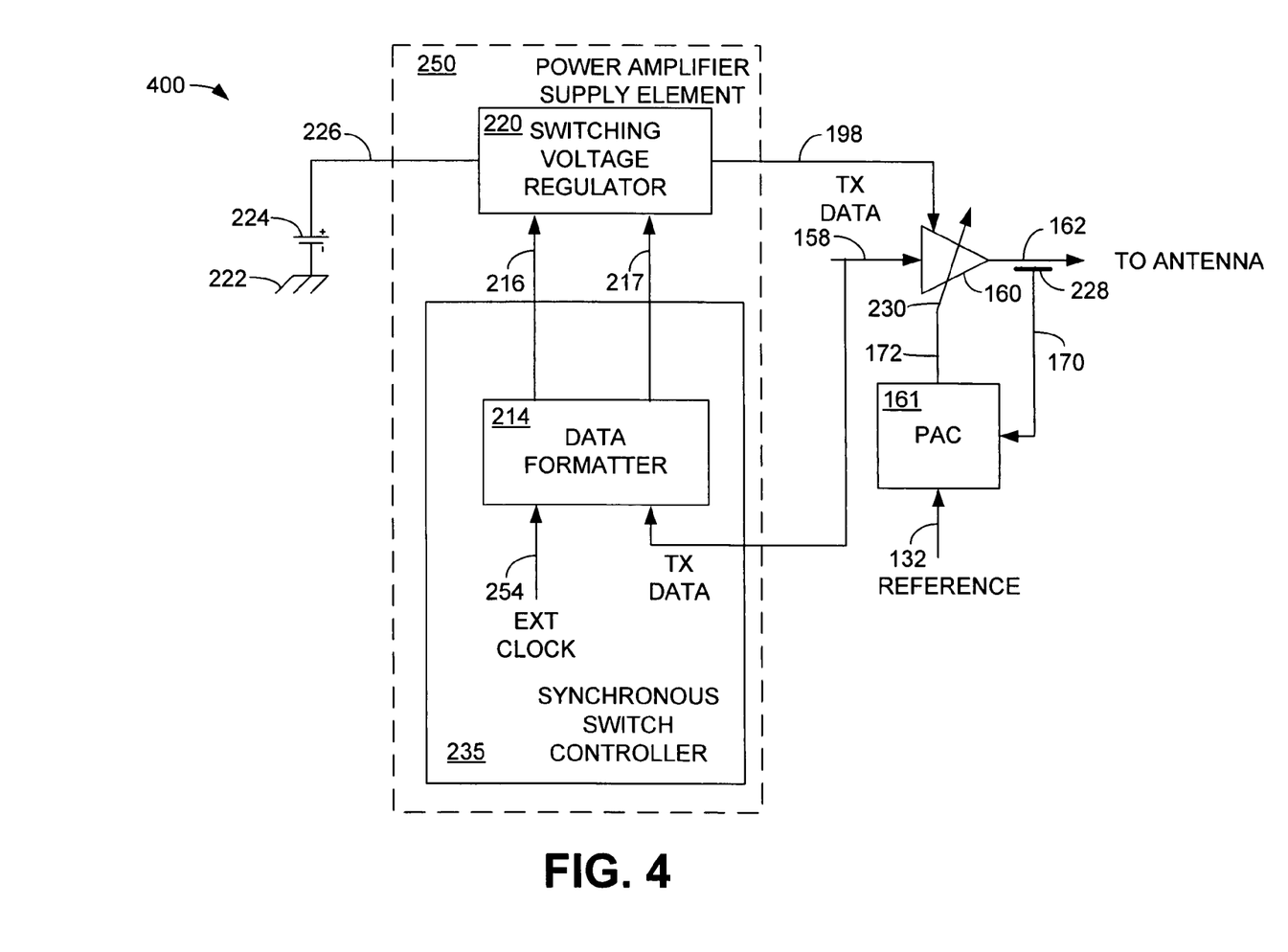
FIG. 4 is a block diagram illustrating an alternative embodiment of the power amplifier supply element of FIG. 3A.

FIG. 4 is a block diagram 400 illustrating an alternative embodiment 250 of the power amplifier supply element 200 of FIG. 3A. The power amplifier supply element 250 includes a synchronous switch controller 235, which includes the data formatter 214. The output of the data formatter 214 is supplied to the switching voltage regulator 220 over connections 216 and 217. However, the data supplied to the data formatter 214 is also the same data used to modulate the high frequency carrier supplied to the power amplifier 160 via connection 158.

Because the transmit data is also used as input to the data formatter, the Manchester data stream on connections 216 and 217 will introduce a voltage ripple that is coherent and coincident with the transmitted data. In this manner, the difference between the spectral data and spectral noise due to the random voltage ripple is harder to detect and therefore more tolerable by the system. A clock signal is also supplied to the data formatter 214 via connection 254. The remaining components of FIG. 4 operate the same as those described above with respect to FIG. 3A.

Figure 5:
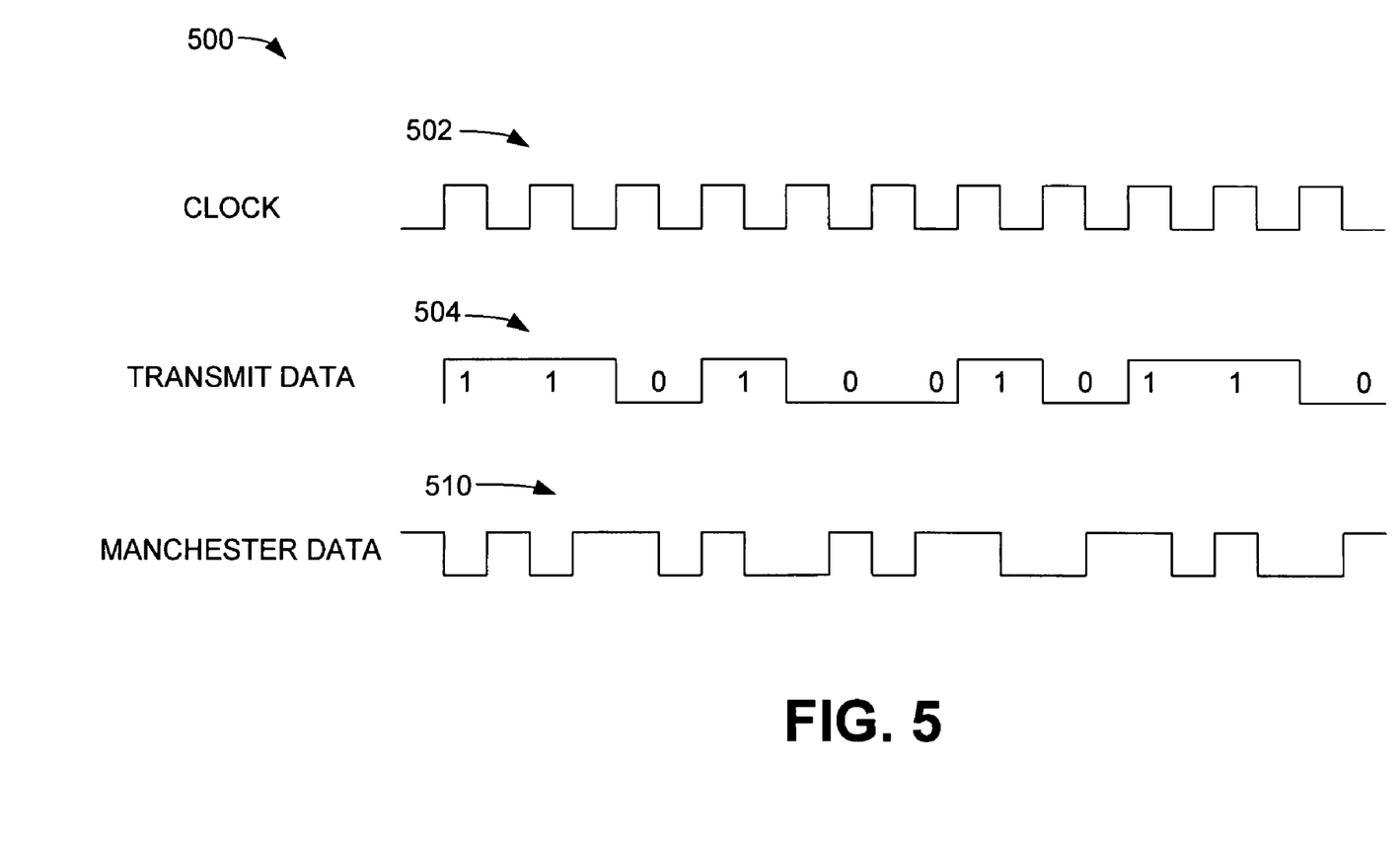
FIG. 5 is a schematic diagram illustrating the clock data, ordinary transmit data and Manchester data waveforms.

FIG. 5 is a schematic diagram 500 illustrating the clock data, ordinary transmit data and Manchester data waveforms. The clock waveform 502 includes a pulse on every bit cycle. The transmit data waveform 506 is essentially a random data waveform that can include a series of logic ones (1's) and logic zeros (0's) in any random order. The Manchester data stream 510 is preferred in this embodiment of the invention, because it includes a voltage transition on every bit cycle. While the transmit data waveform 504 can be relatively random in nature, there are many instances when a long series of logic 1's or logic 0's may comprise the transmit data waveform 504. This situation adds to the undesirable switching ripple because it allows one of the FETs in the switching voltage regulator 220 to remain switched on and the other FET to remain switched off for a period of time exceeding a few microseconds.

Figure 6:
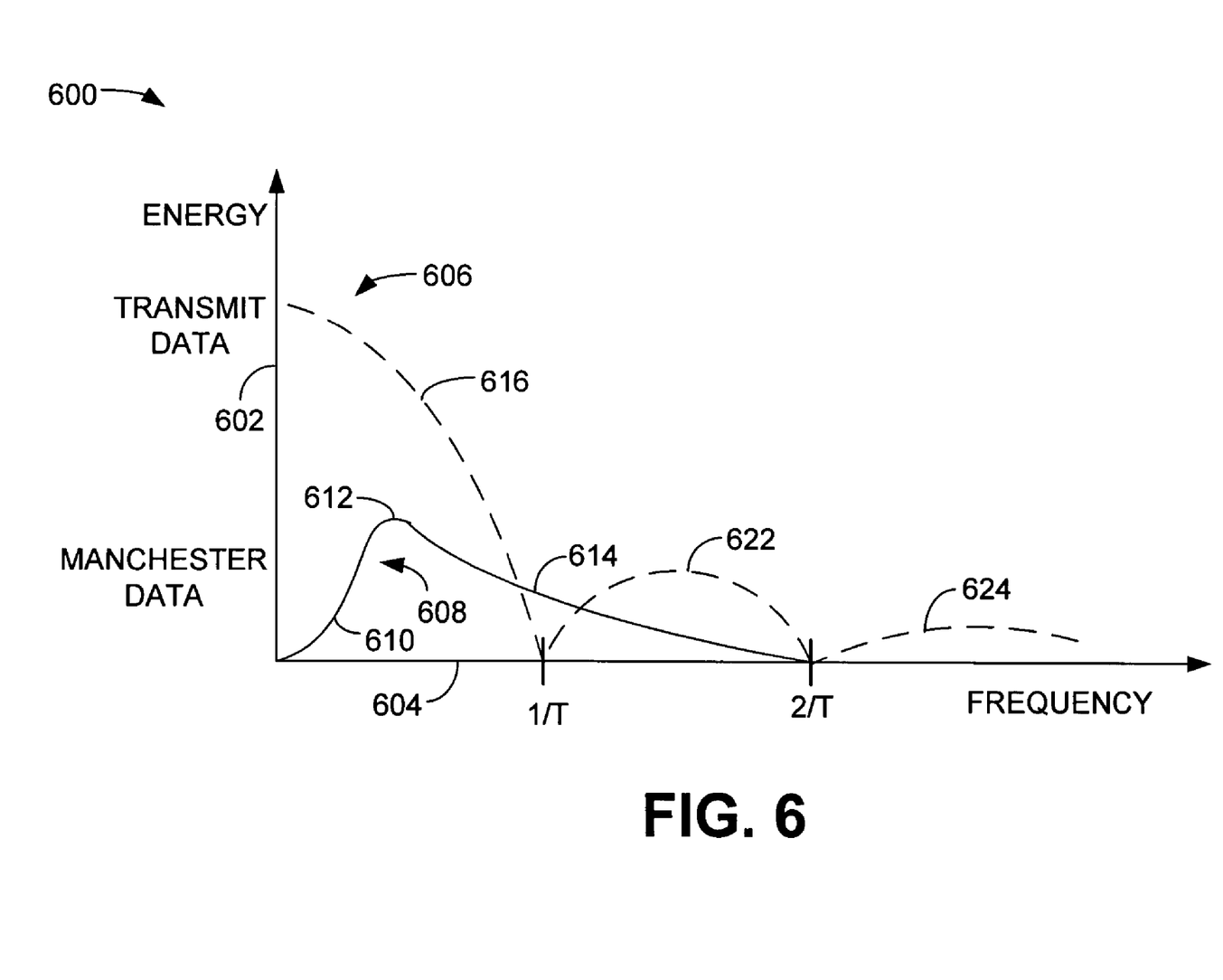
FIG. 6 is a graphical illustration showing the effect of the Manchester data stream supplied to the switching voltage regulator.

FIG. 6 is a graphical illustration 600 showing the effect of the Manchester data stream supplied to the switching voltage regulator 220. The vertical axis 602 represents energy while the horizontal axis 604 represents frequency. The transmit data stream is represented using curve 606 while the Manchester data stream is represented using curve 608. Manchester coding distributes the corrupting energy caused by the switching ripple over the transmit signal band and away from the DC level. By properly selecting the switching frequency, it is possible to distribute the switching ripple away from the transmit modulation (represented as at a maximum at DC in FIG. 6), but close enough so that it rolls off outside of the transmit frequency range. In this manner, the transmit waveform can fall within the transmit mask as shown above in FIG. 1B. By randomizing the data before driving the switching voltage regulator, as described above with respect to FIGS. 3A and 4, the switching ripple caused by the switching effect of the FETs within the switching voltage regulator 220 is distributed over a wide frequency range, and preferably, away from the transmit data waveform.

As shown in FIG. 6, the transmit data waveform 606 includes portion 616 which has its maximum energy level at DC. This energy falls to a minimum at a frequency represented at 1/T, where T is equal to one cycle. The Manchester data waveform 608 has zero energy at DC, and has a smooth ramp-up of power, illustrated by portion 610, to a maximum point indicated by reference numeral 612. This maximum point 612 is distant from the point (DC) at which the transmit data is at a maximum. This is beneficial because the Manchester data spreads the switching ripple over the frequency range from DC to 2/T and because most of the energy of the transmit data stream is now located where the switching ripple pollutes the least. In other words, at DC there is no switching ripple energy. Therefore, when the switching voltage regulator 220 switches data, there is no switching energy present at DC.

Furthermore, because Manchester data provides an energy transition (i.e., a voltage transition) on every bit, the power amplifier is smoothly controlled. Accordingly, as shown by curve 608, and by curved portion 614, by Manchester coding the randomized data supplied to the switching voltage regulator, the total switching ripple energy has a much lower level than it would if the transmit data alone were used to drive the switching voltage regulator.

Figure 7:
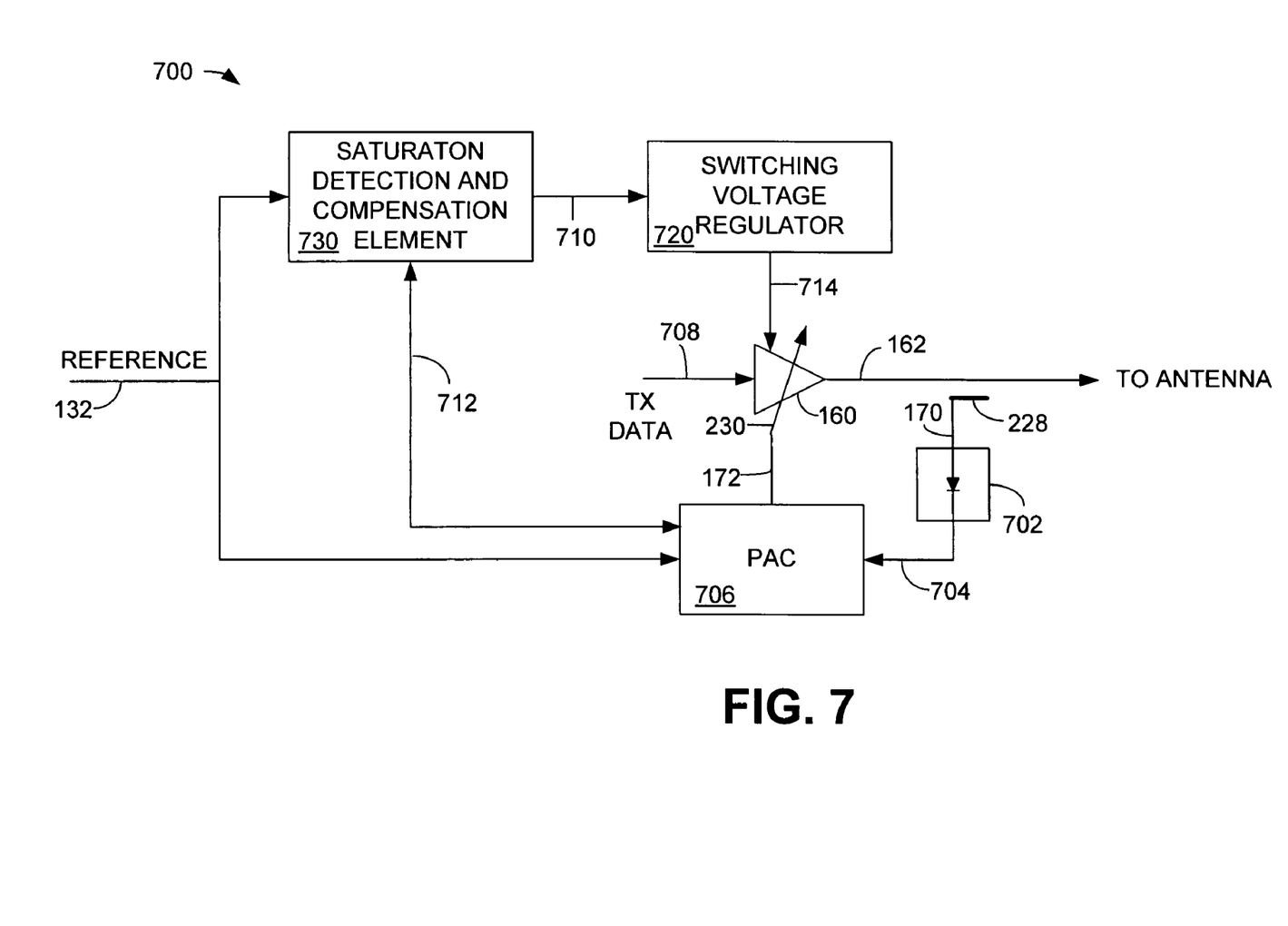
FIG. 7 is a block diagram illustrating an alternative embodiment of the power amplifier supply element of FIGS. 3A and 4.

FIG. 7 is a block diagram 700 illustrating an alternative embodiment of the power amplifier supply element of FIGS. 3A and 4. In the embodiment shown in FIG. 7, the switching voltage regulator 720 is located in a power control loop associated with the power amplifier 160. A reference signal is supplied over connection 132 to a saturation detection and compensation element 730 and to a saturation protected power amplifier control (PAC) element 706. The power amplifier control element 706 generates a power amplifier control signal on connection 172 and generates an offset signal on connection 712. The offset signal on connection 712 is used by the saturation detection and compensation element 730 to adjust the output voltage of the switching voltage regulator 720 via a control signal over connection 710.

The data to be transmitted is supplied to the power amplifier 160 via connection 708. The output of the power amplifier 160 is supplied on connection 162 to the antenna 164 (FIG. 2). A directional coupler 228 supplies power from the output of the power amplifier 160 via connection 170 to the power amplifier control (PAC) element 706. The output of the directional coupler 228 on connection 170 is supplied to a rectifier 702. The rectifier 702 transforms the radio frequency (RF) signal on connection 170 into a DC feedback signal that is supplied via connection 704 to the power amplifier control element 702.

The power amplifier control element 706 includes either an active or passive low pass loop filter. The power amplifier control signal output of the power control element 706 is supplied on connection 172 to the APC input 230 of the power amplifier 160 so that the output of the power amplifier 160 is controlled according to the signal provided by the power control element 706. Under normal circumstances, when the power amplifier 160 is not saturated, the output power is proportional to the control signal on connection 132.

However, it is possible that the power amplifier 160 can become saturated. As the output power of the amplifier 160 increases, the amplifier 160 may enter saturation, in which case any increase in APC (input 230 to the PA 160) does not cause the output power to increase. The ideal output power that maximizes the efficiency of the power amplifier 160 depends on a number of factors. For example, these factors include supply voltage, the power amplifier input and output matching networks (not shown), the power amplifier design, and the temperature at which the power amplifier is operating. Normally, the matching networks (not shown) are embedded in the power amplifier module. However, lowering the supply voltage that is supplied to the power amplifier 160 can force the power amplifier 160 into saturation when operating near maximum power for the handset.

The power control element 706 also supplies an offset signal over connection 712 to the saturation detection and compensation element 730. The offset signal on connection 712 is combined with the reference signal on connection 132 by the saturation detection and compensation element 730. The saturation detection and compensation element 730 provides a control signal to the switching voltage regulator 720 over connection 710 and can supply a signal to the power amplifier control element 706 via connection 712, which can be a bi-directional connection. The output of the saturation detection and compensation element 730 is determined by the level of the offset signal on connection 712.

The control signal supplied by the saturation detection and compensation element 730 on connection 710 determines the output voltage of the switching voltage regulator 720 on connection 714. The output voltage of the switching voltage regulator 720 is adjusted such that the power amplifier 160 will be operated at such level where the system efficiency will be maximized.

When implemented outside the power control loop, as shown in FIGS. 3A and 4, the switching voltage regulator 220 generally provides sufficiently high supply voltage to the power amplifier 160 so that the power amplifier 160 will not enter into saturation. This implies two conditions. First, the overall system efficiency is not as high as it could be because it is always desirable to allow the power amplifier more supply voltage than it needs. This provides a safety margin for device variations, variations in temperature, etc. Second, in the implementation shown above in FIGS. 3A and 4, the switching voltage regulator 220 does not require an analog control signal to determine the voltage to which its output should regulate.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A power amplifier supply circuit, comprising:
   a pair of oppositely polarized semiconductor switches forming at least part of a switching voltage regulator configured to provide a direct current (DC) output; and
   a data formatter configured to supply a data stream to the switching voltage regulator, the data stream having sufficient voltage transitions to spread any alternating current (AC) voltage on the DC output over a bandwidth occupied by data to be transmitted.

2. The circuit of claim 1, wherein the data stream is converted to a Manchester line code.

3. The circuit of claim 2, wherein the data stream is random.

4. The circuit of claim 2, wherein the data stream is a transmit data stream.

5. The circuit of claim 1, wherein the pair of oppositely polarized semiconductor switches and the data formatter are located in a power amplifier control loop.

6. The circuit of claim 1, wherein the pair of oppositely polarized semiconductor switches further comprise a P-type field effect transistor (FET) and an N-type FET.

7. The circuit of claim 2, wherein the Manchester line code distributes switching ripple caused by the pair of oppositely polarized semiconductor switches to a portion of the frequency spectrum having minimal transmit energy.

8. A portable communication handset, comprising:
   a power amplifier supply circuit configured to supply a direct current (DC) voltage;
   a power amplifier configured to receive the DC voltage, wherein the power amplifier supply circuit comprises;
   a switching voltage converter, comprising
      a pair of oppositely polarized transistors; and
      a data formatter configured to supply a data stream to the switching voltage converter, the data stream having sufficient voltage transitions to spread any alternating current (AC) voltage on the DC output over a bandwidth occupied by data to be transmitted.

9. The handset of claim 8, wherein the data stream is converted to a Manchester line code.

10. The handset of claim 9, wherein the data stream is random.

11. The handset of claim 9, wherein the data stream is a transmit data stream.

12. The handset of claim 8, wherein the pair of oppositely polarized semiconductor switches and the data formatter are located in a power amplifier control loop.

13. The handset of claim 8, wherein the pair of oppositely polarized semiconductor switches further comprise a P-type field effect transistor (FET) and an N-type FET.

14. The handset of claim 9, wherein the Manchester line code distributes switching ripple caused by the pair of oppositely polarized semiconductor switches to a portion of the frequency spectrum having minimal transmit energy.

* * * * *